United States Patent
Yajima et al.

(10) Patent No.: US 9,494,296 B2
(45) Date of Patent: Nov. 15, 2016

(54) METHOD OF MANUFACTURING LIGHT EMITTING ELEMENT OF FLUORESCENT LIGHT SOURCE FORMING HIGHLY PRECISE PHOTONIC STRUCTURE IN FLUORESCENCE EMITTING SURFACE OF LIGHT EMITTING ELEMENT

(71) Applicant: USHIO DENKI KABUSHIKI KAISHA, Tokyo (JP)

(72) Inventors: Daisuke Yajima, Yokohama (JP); Kazuyuki Tsuruoka, Yokohama (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/953,740

(22) Filed: Nov. 30, 2015

(65) Prior Publication Data
US 2016/0153624 A1    Jun. 2, 2016

(30) Foreign Application Priority Data

Dec. 2, 2014    (JP) ................................ 2014-244340

(51) Int. Cl.
*H01J 9/00*    (2006.01)
*F21V 9/16*    (2006.01)
*F21Y 101/00*    (2016.01)

(52) U.S. Cl.
CPC . *F21V 9/16* (2013.01); *F21K 9/64* (2016.08); *F21Y 2101/00* (2013.01); *F21Y 2115/30* (2016.08)

(58) Field of Classification Search
CPC .................................. F21K 9/56; F21V 9/16
USPC ...................................................... 445/23–25
See application file for complete search history.

(56) References Cited

U.S. PATENT DOCUMENTS

2009/0206746 A1*  8/2009  Seo ....................... C03C 14/008
                                                                    313/504
2011/0216550 A1    9/2011  Koike et al.

FOREIGN PATENT DOCUMENTS

JP          2011-198560 A    10/2011

* cited by examiner

*Primary Examiner* — Joseph L Williams
(74) *Attorney, Agent, or Firm* — Studebaker & Brackett PC

(57) ABSTRACT

A method manufactures a light emitting element of a fluorescent light source. The method includes forming a photosensitive material layer on a fluorescent substrate, and dividing a coherent beam into branch beams. The method includes causing the branch beams to cross each other thereby generating a first interference beam, and applying an exposure process to the photosensitive material layer with the first interference beam. The method includes producing a second interference beam, and applying the exposure process to the photosensitive material with the second interference beam. The method includes removing those areas of the photosensitive material layer which are irradiated with the first and second interference beams, thereby forming a fine pattern in the photosensitive material layer. The method includes applying an etching process to the fluorescent substrate with the fine pattern of the photosensitive material layer, thereby creating a photonic structure on the fluorescent substrate.

20 Claims, 15 Drawing Sheets

METHOD OF MANUFACTURING LIGHT EMITTING ELEMENT OF FLUORESCENT LIGHT SOURCE FORMING HIGHLY PRECISE PHOTONIC STRUCTURE IN FLUORESCENCE EMITTING SURFACE OF LIGHT EMITTING ELEMENT

TECHNICAL FIELD

The present invention relates to a method of manufacturing a light emitting element having a photonic structure on a surface of the light emitting element. The light emitting element is used for a fluorescent light source. The present invention also relates to a light emitting element having a photonic structure thereon.

DESCRIPTION OF THE RELATED ART

A conventional fluorescent light source device uses a laser beam as an excitation beam, and irradiates a fluorescent substance with the laser beam thereby causing the fluorescent substance to emit fluorescence.

One of such fluorescent light source devices is disclosed in Japanese Patent Application Laid-Open Publication No. 2011-198560. The fluorescent light source device of in Japanese Patent Application Laid-Open Publication No. 2011-198560 includes a substrate, and a wavelength converting element on the substrate. The wavelength converting element has a barium sulfate layer, and a YAG sintered body on the barium sulfate layer. The YAG sintered body is a fluorescent element. In this fluorescent light source device, the surface of the fluorescent element receives the excitation beam, and also emits (releases) the fluorescence.

LISTING OF REFERENCES

PATENT LITERATURE DOCUMENT 1: Japanese Patent Application Laid-Open Publication No. 2011-198560

SUMMARY OF THE INVENTION

In order to improve an emission efficiency of the fluorescence from the surface of the fluorescent element, the above-described fluorescent light source device preferably has a photonic structure on (in) the surface of the fluorescent element (light emitting surface of the wavelength converting element). The photonic structure has periodically a plurality of convex portions.

Conventional methods of fine processing a surface include a patterning process using an NIL (nanoimprint lithography), a patterning process using a stepper, and an alkaline etching. The alkaline etching increases the surface roughness.

The NIL is studied intensively. If a master mold is prepared, a fine processing is easily carried out in a mass production line. This is an advantage of the NIL. In reality, however, the NIL has various problems because the NIL requires the contact between the work and the master mold every time the fine processing is carried out. Specifically, the shape of the master mold may change, the pattern may not be formed in a desired shape if bubbles are trapped when feeding the photoresist, and a fine concave-convex pattern may not be completely transferred to the work if foreign particles are present between the master mold and the work. In principle, the NIL is difficult to apply to the work if the work has a considerably bending portion. For these reasons, the NIL does not have a good yield in the mass production. Thus, the NIL is not suitable for a highly precise patterning.

In addition, the NIL has a cost issue. Because the work contacts the master mold every time the fine concave-convex pattern is transferred to the work in the NIL, the master mold is damaged or deteriorated. Thus, a periodical replacement of the master mold is needed. The master mold has a high-precision fine concave-convex pattern in its large surface, and a relatively expensive electron beam processing and/or a relatively expensive lithography patterning using a KrF stepper should be used with the master mold. Accordingly, a running cost becomes high if the NIL (master mold) is used in the mass production. Also, a new master mold should be prepared every time a design modification is made to a final product. Thus, the NIL is not suitable for a study purpose, and not suitable for production of many kinds of products in small quantities.

The patterning process with the stepper has a shallow depth of focus, and strictly requires that the work has flatness. Thus, the patterning process with the stepper is not suitable for processing a surface of a solid light source.

The surface processing with the alkaline etching is effective to a layer if the layer has good crystalline (i.e., crystal axes in the layer are directed in the same direction), which is obtained by an epitaxial growth method or the like. The surface processing with the alkaline etching can spontaneously form a moth eye structure. However, the surface processing with the alkaline etching is not suitable for a fluorescent substrate that does not have good crystalline. For example, if the fluorescent substrate includes a monocrystal such as YAG sintered body or a polycrystal, the surface processing with the alkaline etching is not suitable because the YAG sintered body does not have good crystalline. The alkaline etching cannot spontaneously form the moth eye structure in a surface of such fluorescent substrate.

An object of the present invention is to provide a method of manufacturing a light emitting element of a fluorescent light source, which can form a highly precise photonic structure in a fluorescence emitting surface of the light emitting element at a low cost.

Another object of the present invention is to provide such light emitting element of a fluorescent light source at a low cost.

According to one aspect of the present invention, there is provided a method of manufacturing a light emitting element for a fluorescent light source. The light emitting element has a fluorescent substrate, which contains a fluorescent material or body. The fluorescent material is excited by an excitation beam. The light emitting element includes a photonic structure on a surface of the fluorescent substrate. A functional material layer may be provided on the fluorescent substrate. If the functional material layer is provided on the fluorescent substrate, the photonic structure is formed on the functional material layer. The method includes forming a photosensitive material layer on the surface of the fluorescent substrate or the surface of the functional material layer. The method also includes dividing a single beam emitted from a coherent light source into at least two branch beams. The method also includes causing the branch beams to cross each other at a predetermined interference angle thereby generating a first interference beam that has interference fringes extending in a first longitudinal direction. The method also includes applying an exposure process to the photosensitive material layer with the first interference beam. The method also includes producing a second interference beam from the branch beams such that the second interference beam has interference fringes extending in a second longitudinal direction. The second longitudinal direction of the interference fringes of the second interference beam crosses the first longitudinal direction of the interference fringes of the first interference beam at a predetermined angle. The second interference beam has the same interference angle as the first interference beam. The method also includes applying the exposure process to the photosensitive material layer with the second interference beam after the step of applying an exposure process to the photosensitive material layer with the first interference beam. The method also includes removing those areas of the photosensitive material layer which are irradiated with the first and second interference beams (or those areas of the photosensitive material layer which are not irradiated with the first and second interference beams), after the exposure process with the first and second interference beams, thereby forming a first fine pattern in the photosensitive material layer. The method also includes applying an etching process to the fluorescent substrate or the functional material layer with the first fine pattern of the photosensitive material layer, thereby creating the photonic structure on the surface of the fluorescent substrate or the surface of the functional material layer.

Thus, the method of manufacturing the light emitting element creates the fine pattern with the exposure process using the interference beams. The exposure process that uses the interference beams does not use a fine photomask when carrying out the fine exposure process. No elements contact the work during the exposure process. Therefore, it is possible to improve the yield in a mass production, as compared to a conventional nanoimprint method. Unlike the nanoimprint method, the method of the present invention does not need an expensive master mold. Therefore, the high-precision patterning process is carried out at a low cost. In addition, the exposure process with the interference beams can perform a highly precise patterning to a fluorescent substrate even if the fluorescent substrate has a monocrystal, such as YAG sintered body, or polycrystal. Accordingly, it is possible to manufacture a light emitting element of a fluorescent light source, which has a fine pattern at two-dimensional periods in the surface of the fluorescent substrate (or in the surface of the functional material layer formed on top of the fluorescent substrate) in an easy manner at high precision.

In the method of manufacturing a light emitting element of a fluorescent light source, the step of producing the second interference beam and the step of applying the exposure process to the photosensitive material layer with the first interference beam may be carried out such that the step of removing those areas of the photosensitive material layer can form the second fine pattern that has a plurality of convex elements and/or a plurality of concave elements in a square array. When the longitudinal direction of interference fringes of the second interference beam crosses the longitudinal direction of interference fringes of the first interference beam at 90 degrees, it is possible to form a moth eye structure in the square array on the photosensitive material layer (or in the surface of the fluorescent substrate).

Alternatively, the step of producing the second interference beam and the step of applying the exposure process to the photosensitive material layer with the second interference beam may be carried out such that the step of removing those areas of the photosensitive material layer can form the first fine pattern that has a plurality of convex elements and/or a plurality of concave elements in a trigonal array. When the longitudinal direction of the interference fringes of the second interference beam crosses the longitudinal direction of the interference fringes of the first interference beam at 60 degrees, it is possible to form a moth eye structure in the trigonal array on the photosensitive material layer (or the surface on the fluorescent substrate). The moth eye structure in the trigonal array has a fine pattern with a greater density than the moth eye structure in the square array.

The method of manufacturing a light emitting element of a fluorescent light source may further include producing a third interference beam from the branch beams such that the third interference beam has interference fringes extending in a third longitudinal direction, which crosses the first longitudinal direction of the interference fringes of the first interference beam at a second predetermined angle. The third interference beam has the same the interference angle as the first interference beam. The method may further include applying the exposure process to the photosensitive material layer with the third interference beam after applying the exposure process to the photosensitive material layer with the second interference beam. By applying the exposure process with the interference beam a plurality of times, it is possible to easily form a desired fine pattern in the photosensitive material layer.

The method of manufacturing a light emitting element of a fluorescent light source may further include turning the fluorescent substrate by the predetermined angle after the step of applying an exposure process to the photosensitive material layer with the first interference beam and before the step of applying the exposure process to the photosensitive material layer with the second interference beam. By turning the fluorescent substrate, it is possible to easily cause the second longitudinal direction of the interference fringes of the second interference beam to cross the first longitudinal direction of the interference fringes of the first interference beam at the predetermined angle.

According to another aspect of the present invention, there is provided a method of manufacturing a light emitting element for a fluorescent light source. The light emitting element has a fluorescent substrate, which contains a fluorescent material or body. The fluorescent material is excited by an excitation beam. The light emitting element includes a photonic structure on a surface of the fluorescent substrate. A functional material layer may be provided on the fluorescent substrate. If the functional material layer is provided on the fluorescent substrate, the photonic structure is formed on the functional material layer. The method includes forming a photosensitive material layer on the surface of the fluorescent substrate or the surface of the functional material layer. The method also includes applying an exposure process to the photosensitive material layer with exposure beams. The method also includes removing those areas of the photosensitive material layer which are irradiated with the exposure beams (or those areas of the photosensitive material layer which are not irradiated with the exposure beams), after the exposure process with the exposure beams, thereby forming a first fine pattern in the photosensitive material layer. The method also includes applying an etching process to the functional material layer with the first fine pattern of the photosensitive material layer, thereby creating the photonic structure on the surface of the functional material layer. In this manner, the functional material layer is disposed on the fluorescent substrate, and the photonic structure is formed on the functional material layer. Therefore, even if it is difficult to precisely form the photonic structure in the fluorescent substrate itself, it is still possible to manufacture the light emitting element of a fluorescent light source, which has the photonic structure in the surface of the light emitting element.

The method of manufacturing a light emitting element of a fluorescent light source may further include, prior to applying the etching process, applying a heat treatment to the first fine pattern formed in the photosensitive material layer, in order to shape the first fine pattern to a desired fine pattern (second fine pattern).

The heat treatment can shape the fine pattern to a desired fine pattern. Thus, it is possible to increase the accuracy of the ultimate fine pattern. When the fine pattern is a plurality of convex portions, the heat treatment can enlarge the size of each convex portion. Thus, it is possible to reduce the spacing between adjacent convex portions. In other words, the heat treatment can shape the first fine pattern to the second fine pattern having a plurality of convex portions at a higher density than the first fine pattern. As a result, the photonic structure can have a moth eye structure (moth eye shape) at a high density.

The photosensitive material layer may be made from a material having a glass-transition temperature. The step of applying a heat treatment may include heating the first fine pattern at a temperature higher than a glass-transition temperature.

When the heat treatment heats the photosensitive material layer at a temperature higher than the glass-transition temperature, it is possible to naturally shape (deform) the fine pattern having anisotropy (e.g., each convex portion having an oval shape when viewed from the top) to a fine pattern having isotropy (e.g., each convex portion having a perfect circular shape when viewed from the top) by taking advantage of the surface tension. The resulting fine pattern in the photosensitive material layer may be used as a mask when the etching process is applied to the fluorescent substrate (or the functional material layer disposed on the fluorescent substrate). The etching process creates a precise moth eye structure on the fluorescent substrate, with each moth eye having a perfect circular shape when viewed from the top.

According to still another aspect of the present invention, there is provided a method of manufacturing a light emitting element for a fluorescent light source. The light emitting element has a fluorescent substrate, which contains a fluorescent material or body. The fluorescent material is excited by an excitation beam. The light emitting element includes a photonic structure on a surface of the fluorescent substrate. A functional material layer may be provided on the fluorescent substrate. If the functional material layer is provided on the fluorescent substrate, the photonic structure is formed on the functional material layer. The method includes dividing a single beam emitted from a coherent light source into at least two branch beams. The method also includes causing the branch beams to cross each other at a predetermined interference angle thereby generating a first interference beam that has interference fringes extending in a first longitudinal direction. The method also includes applying an exposure process to the fluorescent substrate or the functional material layer with the first interference beam. The method also includes producing a second interference beam from the branch beams such that the second interference beam has interference fringes extending in a second longitudinal direction. The second longitudinal direction of the interference fringes of the second interference beam crosses the first longitudinal direction of the interference fringes of the first interference beam at a predetermined angle. The second interference beam has the same interference angle as the first interference beam. The method also includes applying the exposure process to the fluorescent substrate or the functional material layer with the second interference beam after the step of applying an exposure process to the fluorescent substrate or the functional material layer with the first interference beam. The method also includes removing part of the fluorescent substrate or the functional material layer, thereby forming the photonic structure.

Thus, the method of manufacturing the light emitting element creates the fine pattern with the exposure process using the interference beams. Therefore, it is possible to improve the yield in a mass production, as compared to a conventional nanoimprint method. Also, the high-precision patterning process is carried out at a low cost. Accordingly, the light emitting element of the fluorescent light source has a fine pattern in the surface of the fluorescent substrate or in the surface of the functional material layer formed on the surface of the fluorescent substrate, and it is possible to precisely manufacture such light emitting element in an easy manner.

According to yet another aspect of the present invention, there is provided another method of manufacturing a light emitting element of a fluorescent light source. The light emitting element has a fluorescent substrate. The fluorescent substrate contains a fluorescent material or substance, which is excited by an excitation beam. The photonic structure is provided on the surface of the fluorescent substrate. The method includes forming a first layer on the surface of the fluorescent substrate. The method also includes forming a first fine pattern in the first layer. The method also includes applying a heat treatment to the first fine pattern to shape the first fine pattern to a second fine pattern. The method also includes applying an etching process to the fluorescent substrate with the second fine pattern, thereby creating the photonic structure on the surface of the fluorescent substrate.

This light emitting element manufacturing method heat-treats the first fine pattern and shapes the first fine pattern to the second fine pattern. Thus, it is possible to improve the accuracy (preciseness) of the fine pattern in the first layer. The shaped fine pattern (i.e., the second fine pattern) is used as a mask when the etching process is applied to the fluorescent substrate (or the functional material layer on the fluorescent substrate). Thus, it is possible to precisely fabricate the photonic structure on the fluorescent substrate (or the functional material layer) that has a plurality of convex portions closely arranged in the surface of the fluorescent substrate (or in the surface of the functional material layer) at two-dimensional periods. A plurality of sub-groups of convex portions appear repeatedly. The convex portions of the photonic structure has a moth eye structure. The light emitting element manufactured by the above-described method has such photonic structure.

According to another aspect of the present invention, there is provided a light emitting element of a fluorescent light source, which is fabricated by the method according to one of the above-described aspects of the invention. The resulting light emitting element has a precise and fine pattern.

The manufacturing method of the present invention performs the interference exposure, i.e., performs the exposure step with the interference beams. Thus, it is possible to form a highly precise fine pattern, which is made from a photosensitive material layer, at a low cost. Accordingly, it is possible to manufacture a highly precise photonic structure that is formed on the surface of the fluorescent substrate or on the surface of the functional material layer disposed on the fluorescent substrate, at a low cost, and the light emitting element of the fluorescent light source can have such photonic structure at a low cost.

These and other objects, aspects and advantages of the present invention will become apparent to those skilled in the art from the following detailed description when read and understood in conjunction with the appended claims and drawings.

DETAILED DESCRIPTION OF THE INVENTION

Now, embodiments of the present invention will be described with reference to the accompanying drawings.

First Embodiment

Figure 1:
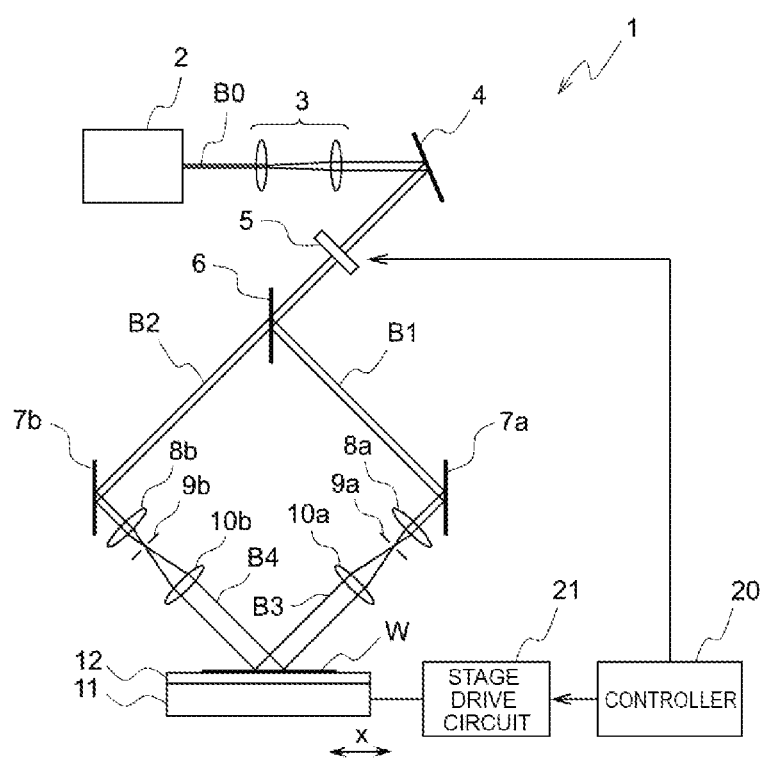
FIG. 1 illustrates a schematic configuration of an exposure device according to a first embodiment of the present invention.

Referring to FIG. 1, an exposure device 1 of this embodiment will be described. The exposure device 1 includes a light source 2, a beam expander 3, a bring-down mirror 4, a shutter 5, a beam splitting element 6, turn-around mirrors 7a and 7b, light condensing lenses 8a and 8b, pin hole elements 9a and 9b, and collimator lenses 10a and 10b. The exposure device 1 also includes a stage 11, a suction table 12, a controller 20, and a stage drive circuit 21.

The light source 2 is a coherent light source that emits coherent light. For example, the light source 2 is a diode-pumped (LD-pumped) solid-state laser that emits a laser beam at a predetermined wavelength $\lambda$. The predetermined wavelength $\lambda$ is, for example, 266 nm. The laser beam B0 emitted from the light source 2 is expanded by the beam expander 3, and the laser beam has an enlarged beam diameter. Then, the optical path of the laser beam is altered by the bring-down mirror 4.

The shutter 5 is configured to block passage of the laser beam therethrough when the shutter 5 is in an ON condition, and allow the laser beam to pass therethrough when the shutter 5 is in an OFF condition. The shutter 5 is disposed between the mirror 4 and the beam splitting element 6. Opening and closing (i.e., OFF and ON) of the shutter 5 is controlled by the controller 20.

The beam splitting element 6 is configured to split a single laser beam B0 into two laser beams B1 and B2. The beam splitting element 6 is a concave-convex diffraction element that has a fine concave-convex shape in its surface, which is made from, for example, quartz. The diffraction takes place by taking advantage of the fine concave-convex shape.

The two laser beams B1 and B2, which are produced by the beam splitting element 6, change the optical paths respectively at the turn-around mirrors 7a and 7b, and are incident to the light condensing lenses 8a and 8b respectively. The two laser beams B1 and B2 may be referred to as "branch beams."

After the light condensing at the light condensing lens 8a, the laser beam is incident to the pin hole 9a such that the laser beam has an enlarged beam diameter. Then, the laser beam is collimated by the collimator lens 10a. In this manner, the laser beam B3, which is a collimated beam, is obtained. Likewise, after the light condensing at the light condensing lens 8b, the laser beam is incident to the pin hole 9b such that the laser beam has an enlarged beam diameter. Then, the laser beam is collimated by the collimator lens 10b. In this manner, the laser beam B4, which is a collimated beam, is obtained.

The pin holes 9a and 9b serve as the spatial filters. The pin holes 9a and 9b are used to remove (eliminate) irregularities or disturbances in the beam wave front, which are generated when the beams travel from the light source 2 to the light condensing lenses 8a and 8b. The collimating lenses 10a and 10b are used to allow the laser beams to have an ideal flat wave front. Thus, the laser beams become plane waves.

Figure 2:
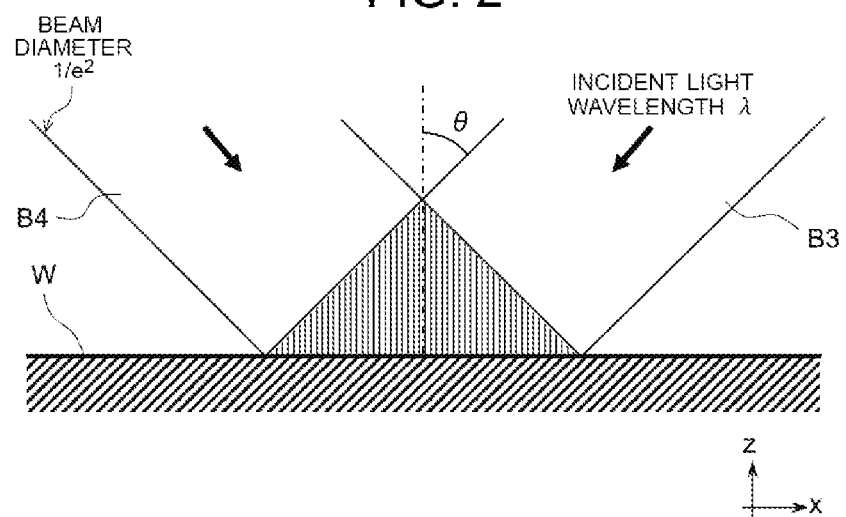
FIG. 2 shows beams used in an exposure process according to the embodiment of the present invention.

As shown in FIG. 2, the two laser beams B3 and B4 cross each other at a predetermined interference angle $2\theta$ (2 theta). Thus, the two laser beams B3 and B4 create, in combination, interference fringes on the work (substrate) W because the two laser beams B3 and B4 interfere with each other. In other words, the two laser beams B3 and B4 creates an interference beam on the work W. The interference beam is used as the exposure beam to be applied to the work W in an exposure process. As such, one exposure can transfer a stripe pattern (line-and-spacing pattern) on the work W.

Therefore, the optical system that includes the beam expander 3, the bring-down mirror 4, the shutter 5, the beam splitting element 6, the turn-around mirrors 7a and 7b, the light condensing lenses 8a and 8b, the pin holes 9a and 9b and the collimating lenses 10a and 10b splits the beam emitted from the light source 2 into the two beams, and causes the two beams to cross each other at the interference angle 20 such that the interference beam is generated. The optical system has a pair of reflection mirrors 7a and 7b, a pair of condensing lenses 8a and 8b, a pair of pin holes 9a and 9b, and a pair of collimating lenses 10a and 10b between the beam splitting element 6 and the work W. This configuration guides and shapes the two laser beams, which are produced by the beam splitting element 6, such that the two laser beams reach the work W respectively, and interference with each other on the work W.

It should be noted that the beam diameter ($1/e^2$) of each of the laser beams B3 and B4 may be decided arbitrarily by changing the magnifications at the beam expander 3, the associated light condensing lens 8a, 8b, and the associated collimating lens 10a, 10b. The beam diameter may be decided appropriately under given conditions such as a purpose of the exposure device 1.

Referring back to FIG. 1, the work W is secured on the suction table 12 disposed on the stage 11. The work W is, for example, a substrate on which a photosensitive material layer (e.g., photoresist layer) is formed. Alternatively, the work W may be a substrate that has a functional material layer on an upper surface of the substrate, and a photosensitive material layer on an upper surface of the functional material layer. The substrate used in this embodiment may be a fluorescent substrate that contains a fluorescent material or substance which is excited by an excitation beam.

The work W is exposed by the interference beams and developed. As a result, a fine pattern is formed on (in) the photosensitive material layer (e.g., photoresist layer). The fine pattern includes a plurality of projections and/or recesses arranged in the photosensitive material layer. If the resist applied on the substrate is a positive resist, those portions of the resist which are irradiated with the interference beam dissolve in the developing liquid. When the positive resist is used, and the above-described exposure process and the development process are carried out, then those portions of the resist which are not irradiated with the interference beam remain in the resist pattern. On the other hand, if the resist is a negative resist, those portions of the resist which are irradiated with the interference beam crosslink and do not dissolve in the developing liquid. When the negative resist is used, and the exposure process and the development process are carried out, then the resulting resist pattern has the irradiated portions remaining after the development.

The stage 11 can move in the X-direction and Y-direction in parallel to the surface of the work W. The X-direction is the right-left direction in FIG. 1. The Y-direction is a direction perpendicular to the drawing sheet of FIG. 1. The controller 20 controls the stage drive circuit 21 to move the stage 11 in the X-direction and/or the Y-direction. Thus, the work W can move in the X-direction and the Y-direction upon movements of the stage 11 in the X-direction and the Y-direction.

Figure 3:
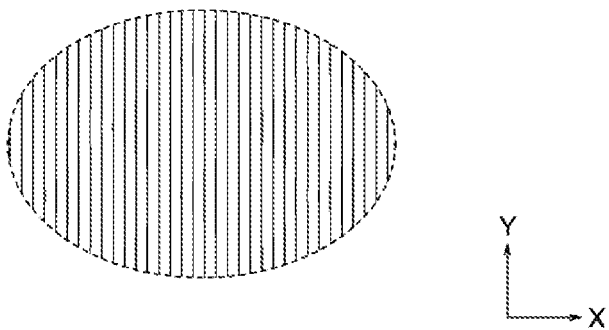
FIG. 3 shows an interference pattern (interference fringes) used in first exposure.

In this embodiment, the exposure is applied to the work W a plurality of times. In the first exposure, the work W is irradiated with, for example, the interference beam that has interference fringes (interference pattern) shown in FIG. 3. The interference pattern of FIG. 3 is a stripe pattern, with the stripe extending in the Y-direction. In the second and subsequent exposure, the stripe interference pattern is turned by a predetermined angle δ from the pattern shown in FIG. 3, and the work W is irradiated with such interference pattern (second interference pattern).

Figure 4:
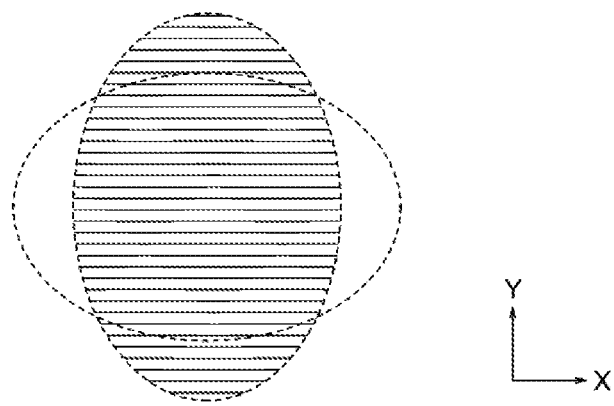
FIG. 4 shows an interference pattern (interference fringes) used in second exposure.

When the stripe interference pattern of FIG. 3 is turned by 90 degrees in order to perform the second and subsequent exposure, the second interference pattern becomes a stripe interference pattern as shown in FIG. 4, with the stripe extending in the X-direction. This interference pattern is applied to the work W. Accordingly, the work W is irradiated with the first interference pattern (first interference beam) and the second interference pattern (second interference beam) in an overlapping manner.

It should be noted that the turning angle δ of the interference pattern is not limited to 90 degrees. Specifically, the turning angle δ may be set to any suitable value from 0 degree to 90 degrees (0°<δ≤90°). It is possible to change the shape of the second interference pattern to be applied to the work W by changing the turning angle δ.

It should also be noted that in the second and subsequent exposure the interference pattern may be turned or the stage 11, which supports work W thereon, may be turned. Preferably the stage 11 is turned because turning the stage 11 is easier.

Figure 5A:
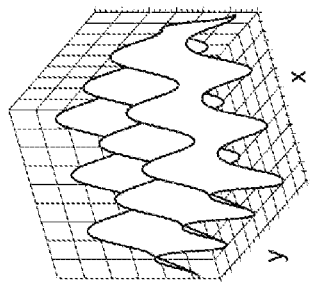
FIG. 5A three-dimensionally illustrates exposure light intensity in the first exposure.
Figure 5C:
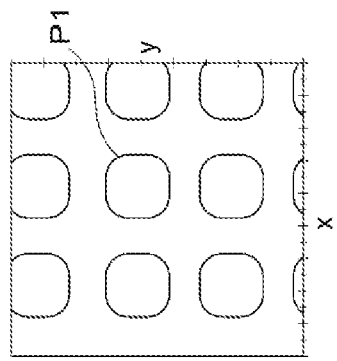
FIG. 5C three-dimensionally illustrates the exposure light intensity in the second exposure when an interference pattern is turned 90 degrees from FIG. 5A.
Figure 5B:
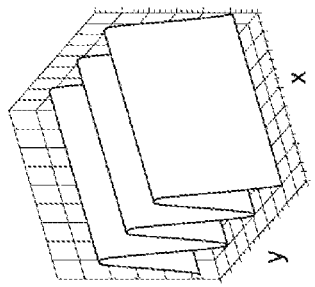
FIG. 5B two-dimensionally illustrates the exposure light intensity in the first exposure.
Figure 5D:
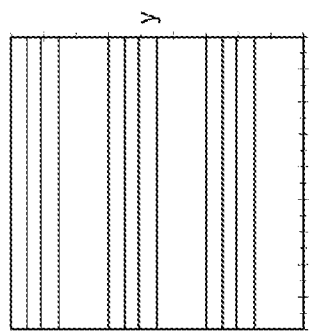
FIG. 5D two-dimensionally illustrates the exposure light intensity in the second exposure when the interference pattern is turned 90 degrees.
Figure 5E:
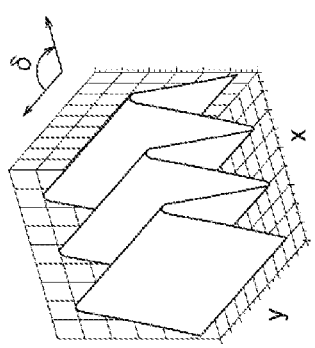
FIG. 5E three-dimensionally illustrates combined exposure light intensity.
Figure 5F:
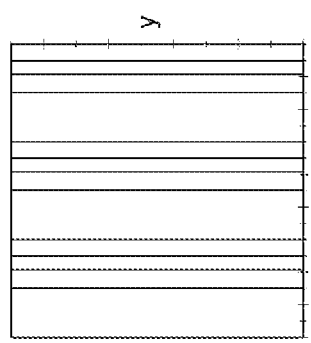
FIG. 5F two-dimensionally illustrates the combined exposure light intensity.

FIGS. 5A and 5B show a calculated distribution of an exposure light intensity in the first exposure. FIGS. 5C and 5D show a calculated distribution of the exposure light intensity in the second exposure when the interference pattern is turned 90 degrees from the first exposure (δ=90 degrees). FIGS. 5E and 5F show the calculated distribution of the combined exposure intensity of the first and second exposure. The combined exposure intensity is obtained by performing the first and second exposure in the overlapping manner. FIGS. 5A, 5C and 5E schematically show the intensity distribution three-dimensionally, and FIGS. 5B, 5D and 5F schematically show the intensity distribution two-dimensionally, respectively. The interference fringes of the first exposure cross the interference fringes of the second exposure at 90 degrees. In other words, the longitudinal direction of the interference pattern in the first exposure crosses the longitudinal direction of the interference pattern in the second exposure at right angles. As a result, the combined pattern of the first and second interference beams has a lattice shape (FIG. 5B+FIG. 5D=FIG. 5F) when viewed from the top (i.e., in the X-Y plane). Therefore, as shown in FIG. 5F, each of those portions P1 which are not irradiated with the interference beams has a substantially circular shape in the X-Y plane. The arrangement of dots P1 is referred to as "dot pattern."

Thus, if the resist is a positive resist, the resulting resist pattern that is obtained after the development has a plurality of columns (circular cylinders) remaining in the resist pattern. In this case, as shown in FIG. 6, a fine pattern has a plurality of columns (dots) P1 that are arranged in a square array.

Figure 7A:
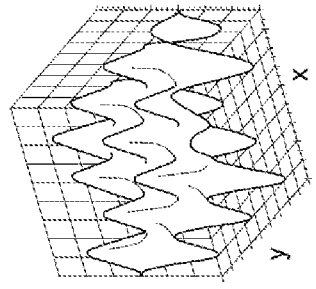
FIG. 7A is similar to FIG. 5A, and three-dimensionally illustrates the exposure light intensity in the first exposure.
Figure 7B:
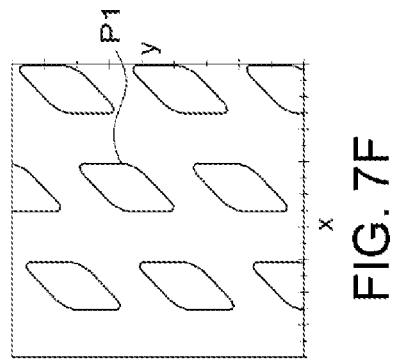
FIG. 7B is similar to FIG. 5B, and two-dimensionally illustrates exposure light intensity in the first exposure.
Figure 7C:
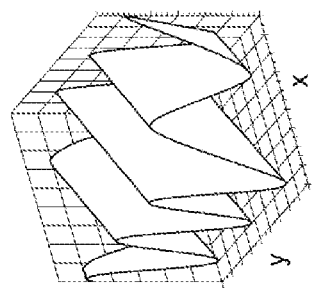
FIG. 7C is similar to FIG. 5C, and three-dimensionally illustrates the exposure light intensity in the second exposure when the interference pattern is turned 60 degrees from FIG. 7A.
Figure 7D:
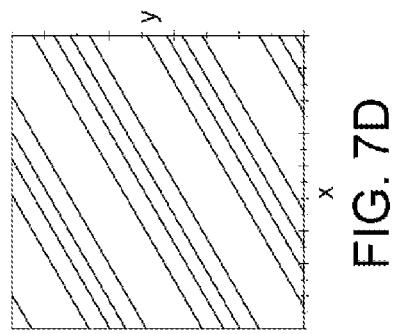
FIG. 7D is similar to FIG. 5D, and two-dimensionally illustrates the exposure light intensity in the second exposure when the interference pattern is turned 60 degrees.
Figure 7E:
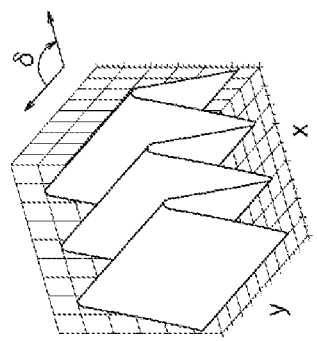
FIG. 7E is similar to FIG. 5E, and three-dimensionally illustrate the combined exposure light intensity.
Figure 7F:
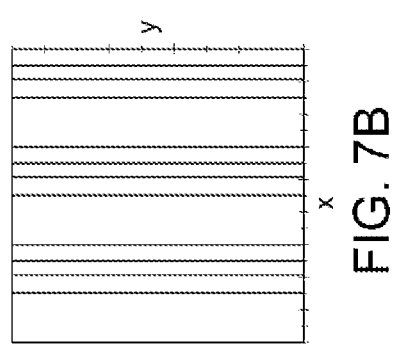
FIG. 7F is similar to FIG. 5F, and two-dimensionally illustrate the combined exposure light intensity.

FIGS. 7A to 7F are similar to FIGS. 5A to 5F, and show the exposure light intensities when the interference pattern used in the first exposure is turned 60 degrees and used in the second exposure (δ=60 degrees). FIGS. 7A and 7B show a calculated distribution of an exposure light intensity in the first exposure. FIGS. 7C and 7D show a calculated distribution of the exposure light intensity in the second exposure. FIGS. 7E and 7F show the calculated distribution of the combined exposure light intensity of the first and second exposure. FIGS. 7A, 7C and 7E schematically show the intensity distribution three-dimensionally, and FIGS. 7B, 7D and 7F schematically show the intensity distribution two-dimensionally, respectively. The longitudinal direction of the interference pattern in the first exposure crosses the longitudinal direction of the interference pattern in the second exposure at 60 degrees. Then, each of those portions (dot pattern) P1 which are not irradiated with the interference beams has a substantially oval shape in the X-Y plane.

Figure 8:
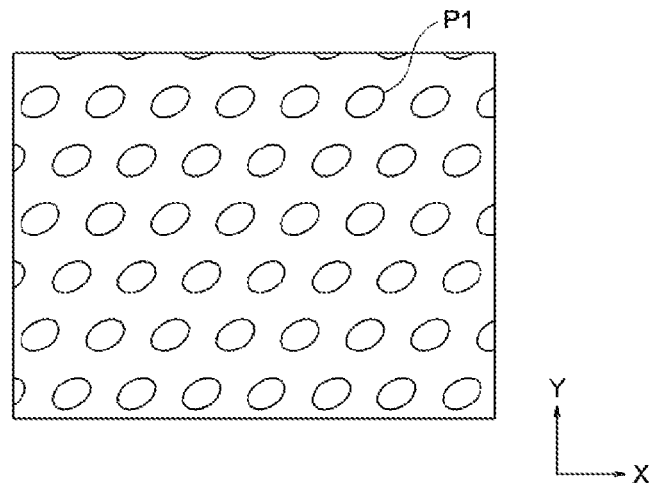
FIG. 8 shows a resist pattern when the first exposure and the second exposure are carried out, with the interference pattern being turned 60 degrees after the first exposure.

Thus, if the resist is a positive resist, the resulting resist pattern that is obtained after the development has a plurality of oval columns (elliptic cylinders) remaining in the resist pattern. In this case, as shown in FIG. 8, a fine pattern has a plurality of oval columns (dots) P1 that are arranged in a trigonal array.

Figure 6:
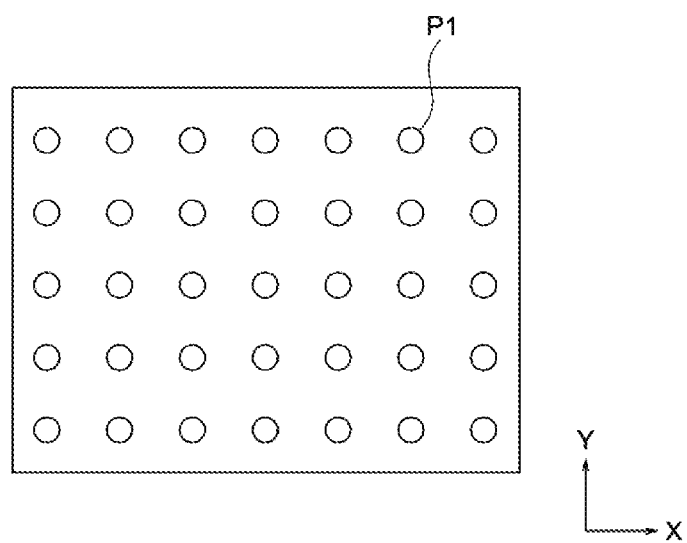
FIG. 6 shows a resist pattern obtained when the first exposure and the second exposure are carried out, with the interference pattern being turned 90 degrees after the first exposure.

As described above, when the interference pattern used in the first exposure is turned 60 degrees and used in the second exposure (FIG. 8), the dot pitch is reduced, as compared to when the interference pattern used in the first exposure is turned 90 degrees and used in the second exposure (FIG. 6). Thus, it is possible to fabricate a resist pattern having a desired dot density in the X-Y plane by altering the angle difference δ of the interference pattern between the first exposure and the second exposure.

In this embodiment, a heat treatment may be applied to the obtained resist pattern such that the dots in the pattern have a desired shape.

The inventors found that the pattern (dot) P can have a perfect circular shape if a heat treatment is properly applied to the resist pattern obtained after the above-described exposure and development. In this embodiment, therefore, the resist pattern is shaped to a perfect circle by heating the resist pattern at a temperature that is higher than the glass-transition temperature of the resist.

Figure 9:
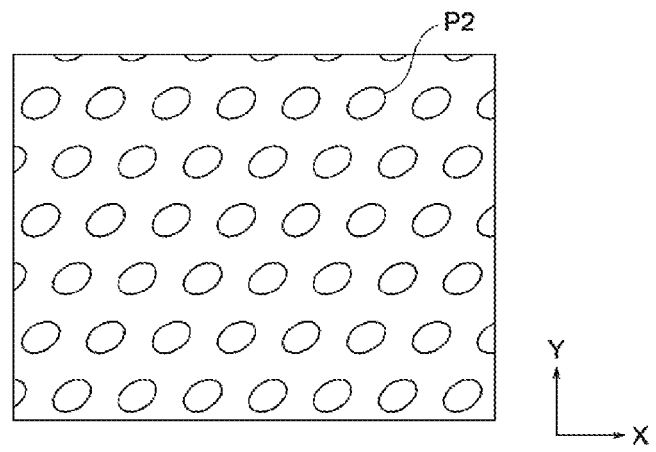
FIG. 9 shows a resist pattern when the heat treatment is applied at an insufficient temperature. The resist pattern has a plurality of dots that are the same as FIG. 8.

FIG. 9 shows a result, which was obtained after the heat treatment was applied to the resist pattern P1 shown in FIG. 8 at a temperature below the glass-transition temperature of the resist. The glass-transition temperature of the resist was approximately between 140 degrees C. and 150 degrees C. The heat treatment was applied to the resist at the temperature of 130 degrees C. for ten minutes. As illustrated in FIG. 9, the resist pattern P2, which was obtained after the heat treatment, did not change from the resist pattern P1 when the heat treatment was carried out at a temperature below the glass-transition temperature. Thus, no shaping took place.

Figure 10:
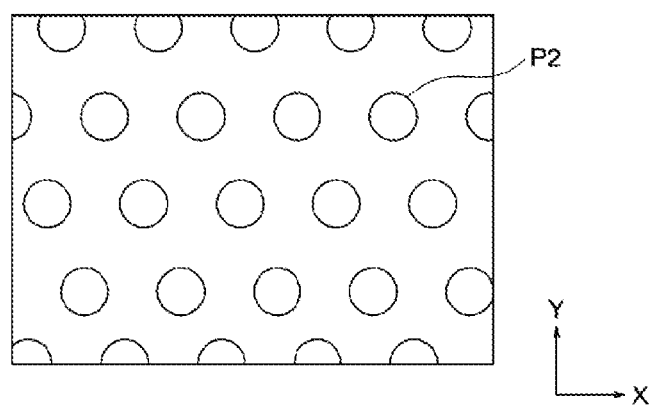
FIG. 10 shows a resist pattern that has a plurality of dots which are properly shaped by the heat treatment.

On the contrary, when the heat treatment was applied to the resist pattern P1 shown in FIG. 8 at a temperature over the glass-transition temperature of the resist, the resist pattern P1 was shaped to a desired shape. The result is shown in FIG. 10.

The glass-transition temperature of the resist was approximately between 140 degrees C. and 150 degrees C. The heat treatment was applied to the resist at the temperature of 200 degrees C. (heating temperature) for ten minutes (heating time). As mentioned above, when the heat treatment was carried out at the temperature over the glass-transition temperature, the resist pattern was shaped to a desired shape, i.e., the pattern P2 has had a perfect circular shape after the heat treatment as shown in FIG. 10. In this manner, it is possible to shape the resist pattern having the oval shape to a resist pattern having a perfect circular shape by the heat treatment. Therefore, it is possible to obtain the perfect circular dot pattern in the trigonal array.

As described above, it is possible to fabricate the resist pattern having a desired dot density in the surface of the resist (X-Y plane) by altering the turning angle (angle difference) δ of the interference pattern between the first exposure and the second exposure. Thus, it is possible to manufacture the resist pattern having perfect circular dots at a desired density by carrying out the exposure a plurality of times with an appropriate angle difference between the first interference beam and the second interference beam, and carrying out the heat treatment under appropriate conditions after the development.

The resist, which is obtained after the heat treatment in the above-described manner (FIG. 10), is used as a mask, and an etching is applied to the substrate, which has the resist on top thereof, or the functional material layer disposed on the substrate. As a result, those portions of the substrate or the functional material layer which are not covered with the resist are removed by the etching process. Accordingly, the surface of the substrate or the surface of the functional material layer has a convex structure. This convex structure has a plurality of convex portions at two-dimensional periods. This convex structure is a moth eye structure. Therefore, it can be said that the substrate has a moth eye structure thereon. As described above, each dot in the resist pattern after the heat treatment is shaped to a perfect circular shape. Accordingly, it is possible to fabricate a highly precise moth eye structure with each dot (eye) having a perfect circular shape at its bottom.

It should be noted that the heating conditions in the heat treatment, such as the heating temperature and the heating time, may be adjusted to alter the size of the dot(s) in the resist pattern.

Figure 11:
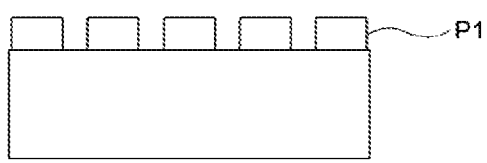
FIG. 11 is a cross-sectional view of an exemplary resist pattern prior to the heat treatment.
Figure 12:
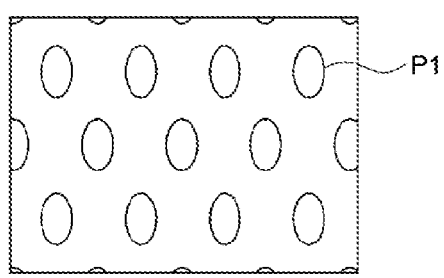
FIG. 12 is a plan view of the resist pattern shown in FIG. 11.

FIG. 11 illustrates a cross-sectional view of an exemplary resist pattern prior to the heat treatment. For example, when the turning angle (angle difference) δ of the interference pattern between the first exposure and the second exposure is 60 degrees, the resist pattern has a plurality of oval dots P1 arranged as shown in FIG. 12, when viewed from the top.

These dots P1 are arranged in a trigonal array in the X-Y plane. Thus, the shape of each of the dots (fine structure) P1 prior to the heat treatment is an elliptic column when the turning angle of the interference pattern between the first exposure and the second exposure is 60 degrees. The vertical cross-sectional view of each column P1 is approximately rectangular, as shown in FIG. 11.

Figure 13:
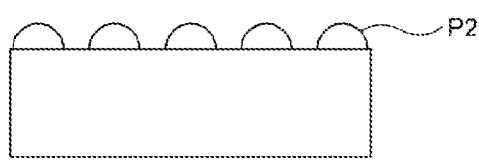
FIG. 13 is a cross-sectional view of a resist pattern which is obtained after the dots in the resist pattern are shaped by the heat treatment.
Figure 14:
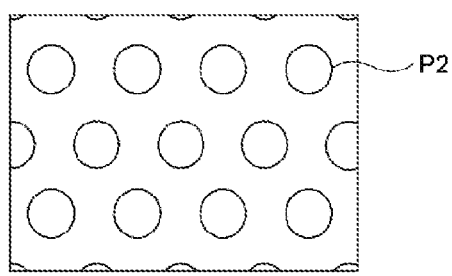
FIG. 14 is a plan view of the resist pattern shown in FIG. 13.

The heat treatment is applied to the resist pattern shown in FIG. 11. Then, the fine structure P1 is shaped to a fine structure P2 having a hemispherical shape, as shown in FIG. 13. FIG. 13 is a cross-sectional view. The fine structure P2 has a peak and expands downward from the peak toward the substrate, with its diameter also increasing. The heat treatment is carried out at the heating temperature of 185 degrees C. for ten minutes. The shape of the fine structure P2 in the X-Y plane becomes a perfect circle, as shown in FIG. 14.

Figure 15:
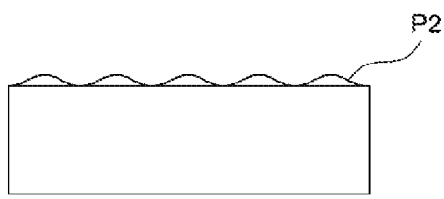
FIG. 15 is a cross-sectional view of a resist pattern which is obtained after the dots in the resist pattern are shaped by the heat treatment at a higher temperature than FIG. 13.
Figure 16:
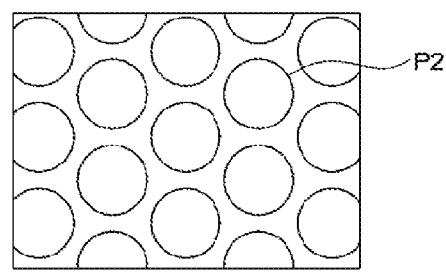
FIG. 16 is a plan view of the resist pattern shown in FIG. 15.
Figure 17:
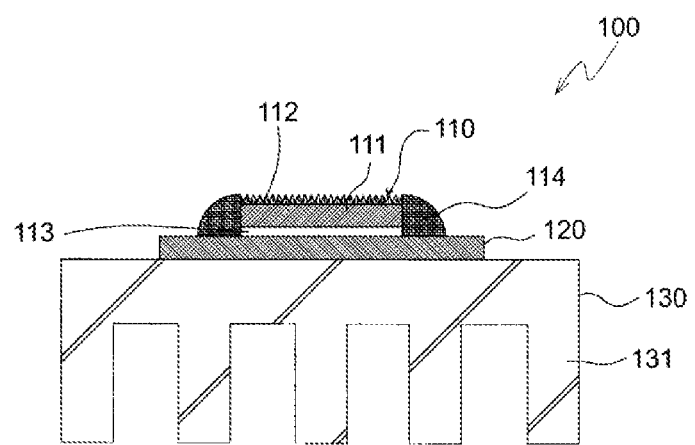
FIG. 17 shows an exemplary configuration of a light emitting element for a fluorescent light source.

If the conditions of the heat treatment are changed, i.e., the heat treatment is carried out at the heating temperature of 215 degrees C. for ten minutes, then a resist pattern shown in FIG. 15 is obtained after the heat treatment. FIG. 15 shows a cross-sectional view of the resist pattern. The fine structure P2 shown in FIG. 15, which results after the heat treatment, has a shorter hemispherical shape than the fine structure P2 shown in FIG. 13, which also results after the heat treatment. The shape of the fine structure P2 (FIG. 15) in the X-Y plane is depicted in FIG. 16. The perfect circular shape of the fine structure P2 shown in FIG. 16 has a larger diameter than the perfect circular shape of the fine structure P2 shown in FIG. 14.

As understood from the foregoing, when the heating temperature of the heat treatment is raised, the dot diameter becomes larger even if the heating time is unchanged. Thus, the spacing between neighboring fine structures (dots) becomes smaller. In other words, the distance between the adjacent fine structures (dots) P2 decreases in the resist pattern, and the fine structures P2 are arranged close(r) to each other.

As described above, the dot diameter can be altered upon the heat treatment, by altering the heating conditions of the heat treatment. This can change the density of the fine structures (dots) to be made in the surface of the photonic structure.

It should be noted that although the heating temperature is altered in the foregoing, the heating time may additionally be altered or the heating time may be altered instead of the heating temperature. It is also possible to change the dot diameter upon the heat treatment, if the heating time is changed. In order to obtain a desired dot diameter (or a desired dot density of the resist pattern), the heating conditions may be appropriately altered or adjusted in accordance with the material of the resist, the material of the substrate located under the resist, or other factors.

The above-described method of fabricating a fine structure on the substrate may be used in manufacturing a light emitting element of a fluorescent light source. The configuration of the light emitting element will be described in detail with reference to FIGS. 17A to 17F.

The light emitting element 100 of the fluorescent light source has a wavelength converting element 110 that emits fluorescence upon excitation with an excitation beam.

For example, the excitation beam may be a beam from a laser diode. It should be noted that the excitation beam may be any other suitable beam as long as the excitation beam can excite the fluorescent material or substance. For example, the excitation beam may be a combination of a plurality of beams from LEDs. Alternatively, the excitation beam may be a beam from a lamp that is filled with mercury, xenon or the like. If the light source of the excitation beam is a lamp or LED(s), which has a certain width in the radiation wavelength, then the wavelength of the excitation beam becomes a dominant radiation wavelength.

The wavelength converting element 110 has a fluorescent member (fluorescent substrate) 111, and a photonic structure 112 formed on the upper surface of the fluorescent element 11. The fluorescent member 111 has a circular disk shape. The photonic structure 112 has a substantially circular disk shape. In the wavelength converting element 110, the upper surface of the photonic structure 112 serves as the surface to receive the excitation beam, and also serves as the surface to emit fluorescence.

The photonic structure has a plurality of convex portions arranged at two-dimensional periods.

The lower surface of the wavelength converting element 110, i.e., the lower surface of the fluorescent member 111, has a light reflection film 113 thereon. The light reflection film 113 is a multi-layer film. A diffuse reflection member 114 is disposed along the side face of the wavelength converting element 110. The diffuse reflection member 114 has an annular shape, and is in close contact with the side face of the wavelength converting element 10. The diffuse reflection member 114 may be made from a mixture of silicone and a diffusing particle (e.g., alumina or titania), or a dried ceramics paste that contains an alkaline metal. Because the wavelength converting element 110 includes the light reflection film 13 and the diffuse reflection member 114, the wavelength converting element 110 is imparted the reflecting function on both of the side and lower surfaces thereof.

The lower surface of the wavelength converting element 110, i.e., the lower surface of the light reflection film 113, is joined to the upper surface of the substrate 120 by a bonding element (not shown). The bonding element is preferably a solder or a silver sintered element if heat release or heat transfer is considered. A heat radiating member 130 is provided below the substrate 120. The heat radiating member 130 is made from a metal such as copper. The heat radiating member 130 has a plurality of fins 131 for heat radiation.

The fluorescent element 111 contains a fluorescent material or substance. Specifically, the fluorescent element 111 has a monocrystal fluorescent material or a polycrystal fluorescent material. Alternatively, the fluorescent element 111 has a sintered body which is made from a mixture of a monocrystal (or polycrystal) fluorescent material and a ceramic binder.

The fluorescent material of the fluorescent element 111 may be a YAG ($Y_3Al_5O_{12}$), LuAG ($Lu_3Al_5O_{12}$), CASN ($CaAlSiN_3$:Eu) and SCASN (($Sr$, $Ca$)$AlSiN_3$:Eu).

The inorganic compound layer of the photonic structure 112 may be made from alumina ($Al_2O_3$), hafnium oxide ($HfO_2$), magnesium oxide ($MgO$), tin oxide ($SnO_2$), tungsten oxide ($WO_3$), yttrium oxide ($Y_2O_3$), indium oxide (ITO), zirconia ($ZrO_2$), tantalum oxide ($Ta_2O_5$), titanium oxide ($TiO_2$), niobium oxide ($Nb_2O_5$) or other metallic oxide. Alternatively, the inorganic compound layer of the photonic structure 112 may be a mixture of zirconia ($ZrO_2$) and titanium oxide ($TiO_2$).

The fluorescent light source device directs (emits) the excitation beam to the excitation beam receiving surface of the wavelength converting element 110 of the light emitting element 100 at substantially 90 degrees, i.e., directs the excitation beam to the surface of the photonic structure 112 at substantially right angles. Thus, the excitation beam is incident to the fluorescent member 111 via the photonic structure 112. The fluorescent material of the fluorescent member 111 is excited by the excitation beam such that fluorescence is emitted from the fluorescent member 111. The fluorescence is emitted from the surface of the photonic structure 112, i.e., fluorescence emitting surface. Then, the fluorescence is reflected by a dichroic mirror or the like, and guided out of the fluorescent light source device.

FIGS. 18A to 18F show, in combination, an exemplary method of manufacturing a light emitting element of a fluorescent light source device.

Figure 18A:
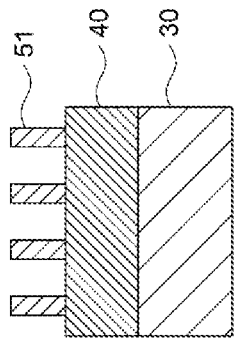
FIGS. 18A to 18F show, in combination, a method of manufacturing a light emitting element for a fluorescent light source.

Referring to FIG. 18A, a fluorescent substrate 30 is prepared. The fluorescent substrate 30 has a functional material layer 40 thereon. The fluorescent substrate 30 is a YAG sintered body or the like. The functional material layer 40 is made from, for example, zirconia ($ZrO_2$). The functional material layer 40 is formed on the fluorescent substrate 30 by a deposition method such as sputtering. It should be noted that the material of the fluorescent substrate 30 and the material of the functional material layer 40 may be appropriately decided in accordance of use of a final product or other factors.

Figure 18B:
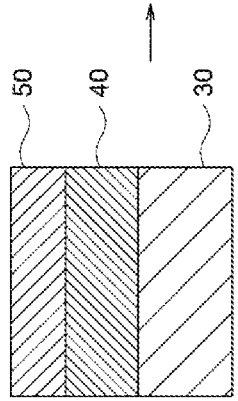

The first step of the manufacturing method is shown in FIG. 18B. In the first step, a photosensitive material layer (e.g., photoresist layer) 50 is formed on the functional material layer 40. In the second step of the manufacturing method, the above-described two-beam interference exposure is applied to the photoresist 50 a plurality of times in order to expose the photoresist 50.

Figure 18C:
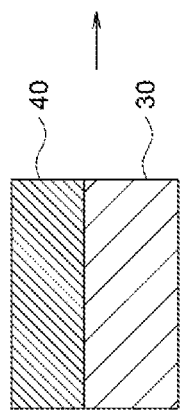

In the third step of the manufacturing method, the exposed photoresist 50 is developed. Thus, those portions of the photoresist 50 which are irradiated with the interference beams are removed. Then, a fine pattern 51 is created, as shown in FIG. 18C. The fine pattern 51 has a dot pattern.

Figure 18D:
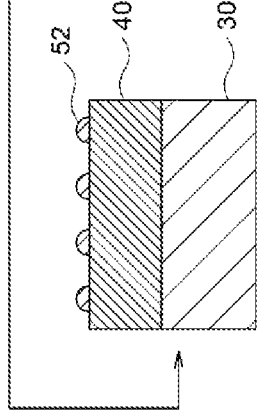

In the fourth step of the manufacturing method, the heat treatment is applied to the fine pattern 51 of the photoresist 50, which is obtained in the third step. This is a step of shaping the fine pattern 51. The oval shape of each dot in the fine pattern 51 is shaped to a circular shape by the shaping step. During the shaping step, the heat treatment is performed with, for example, a hot plate. As a result, the fine pattern 52 shown in FIG. 18D is obtained. The fine pattern 52 has a hemispherical shape in its vertical cross-sectional view.

Figure 18E:
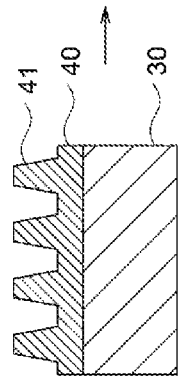

In the fifth step of the manufacturing method, the fine pattern 52, which is obtained in the fourth step, is used as a mask to carry out the etching to the functional material layer 40. Subsequently, the fine pattern 52 of the photoresist is removed to obtain the fine pattern 41 in the functional material layer as shown in FIG. 18E.

Figure 18F:
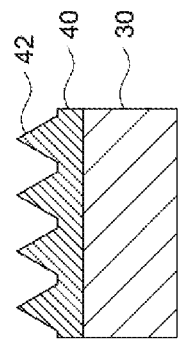

In the final step of the manufacturing method, the sputtering is applied to the fine pattern 41 of the functional material layer, which is obtained in the fifth step. As a result, the light emitting element of the fluorescent light source has a moth eye structure or a photonic structure 42 as shown in FIG. 18F.

In the exemplary method shown in FIGS. 18A-18F, the photonic structure 42 is formed on the surface of the functional material layer 40 disposed on the fluorescent substrate 30. It should be noted that the present invention is not limited in this regard. For example, the fine pattern 52 of the photoresist 50 may be formed on the surface of the fluorescent substrate 30, and the fine pattern 52 may be used as the mask to carry out the etching to the fluorescent substrate 30. Then, it is possible to form the photonic structure 42 on the surface of the fluorescent substrate 30.

In the example shown in FIGS. 18A-18F, the photosensitive material layer (e.g., photoresist layer) 50 is formed on the upper surface of the functional material layer 40, and the exposure and the development are carried out to the photosensitive material layer to obtain the fine resist pattern. Then, the heat treatment is applied to the fine resist pattern to shape the resist pattern. It should be noted that the present invention is not limited in this regard. For example, a layer (e.g., resin layer having the glass-transition temperature) 50 may be formed on the surface of the functional material layer 40 disposed on the substrate 30 or formed on the surface of the fluorescent substrate 30. The fine pattern 51 may be formed on the layer 50 by, for example, the NIL or a hot embossing process, not by the exposure and the development. Then, the heat treatment may be applied to the fine pattern 51 to shape the fine pattern 51 such that the fine pattern 52 is obtained. The fine pattern 52 may be used as the mask when etching the functional material layer 40 or the fluorescent substrate 30.

As described above, in this embodiment, the single beam emitted from the coherent light source is divided into two beams, and the two beams are forced to cross each other at the predetermined interference angle such that the interference beams are produced. These interference beams are used to expose the photoresist. In the exposure process, the two-beam interference exposure is carried out a plurality of times. In the second and subsequent interference exposure, the longitudinal direction of the interference fringes applied to the photoresist is turned such that the longitudinal direction of the interference fringes of the second interference exposure intersects the longitudinal direction of the interference fringes applied to the photoresist in the first interference exposure at the predetermined angle. After the exposure, the development process is applied to the resist pattern to obtain the fine resist pattern.

The two-beam interference exposure does not use a fine photomask, but is still able to expose an object (work) with a fine pattern. In the two-beam interference exposure, nothing contacts the work. Thus, the two-beam interference exposure improves the yield, as compared to the NIL or the like which requires the contact between the work and the master mold every time the fine processing is carried out (every time the fine concave-convex pattern is transferred to the work from the master mold).

Also, the two-beam interference exposure can expose the work at a very deep depth of focus. Thus, the flatness of the work does not matter in the two-beam interference exposure. For example, the nanoimprint method may damage or break the work if the work has a bending portion. Further, the transfer process in the nanoimprint method may become insufficient if the work has a bending portion. In view of such facts, the two-beam interference exposure is employed in the embodiment of the present invention. The two-beam interference exposure is employed because the exposure can precisely be carried out even if the work has a bending portion.

In the nanoimprint method, the frequent contact between the work and the master mold deteriorates (damages) the master mold. Thus, the master mold needs to be monitored and replaced. On the other hand, the two-beam interference exposure does not need such monitoring and replacement. The two-beam interference exposure can ensure the stable quality without such monitoring and replacement. Furthermore, unlike the nanoimprint method, the two-beam interference exposure does not need a master mold, which is expensive and consumable. Thus, the two-beam interference exposure can reduce the cost.

The two-beam interference exposure is not a chemical process such as an alkaline etching. The two-beam interference exposure is lithography. Thus, the material of the work does not matter.

A processing with the alkaline etching is effective to an LED (e.g., monocrystal of GaN or AlN), and practiced in various fields. The semiconductor material layer of the LED is a film that is grown by an epitaxial growth process or the like, and therefore semiconductor material layer has good crystalline (the crystal axes extend in the same direction). Thus, if the semiconductor material layer is subjected to alkali, that face which has a low chemical etching rate is preserved because a surface energy of a certain crystal plane is small. Then, a moth eye structure is spontaneously formed.

However, the fluorescent substance plate (phosphor plate) made from, for example, YAG does not have good crystalline, unlike the film that is grown by the epitaxial growth process. Accordingly, the fluorescent substance plate cannot spontaneously form a moth eye structure with the alkaline etching. On the other hand, the two-beam interference exposure can appropriately form a moth eye structure when the two-beam interference exposure is applied to the fluorescent substance plate made from YAG or the like.

It is possible to improve the accuracy of the resist pattern by heat treating the fine pattern, which is obtained after the development process, and shaping the fine pattern. If the heat treatment is carried out at a temperature over the glass-transition temperature, then the fine pattern having anisotropy is naturally (automatically) shaped to the fine pattern having isotropy due to the surface tension.

Thus, the fine projections (convex portions) are arranged on the work at two-dimensional periods by carrying out the etching process with the above-described photoresist. The work can therefore have a photonic structure that has a regulated moth eye shape.

Figure 19:
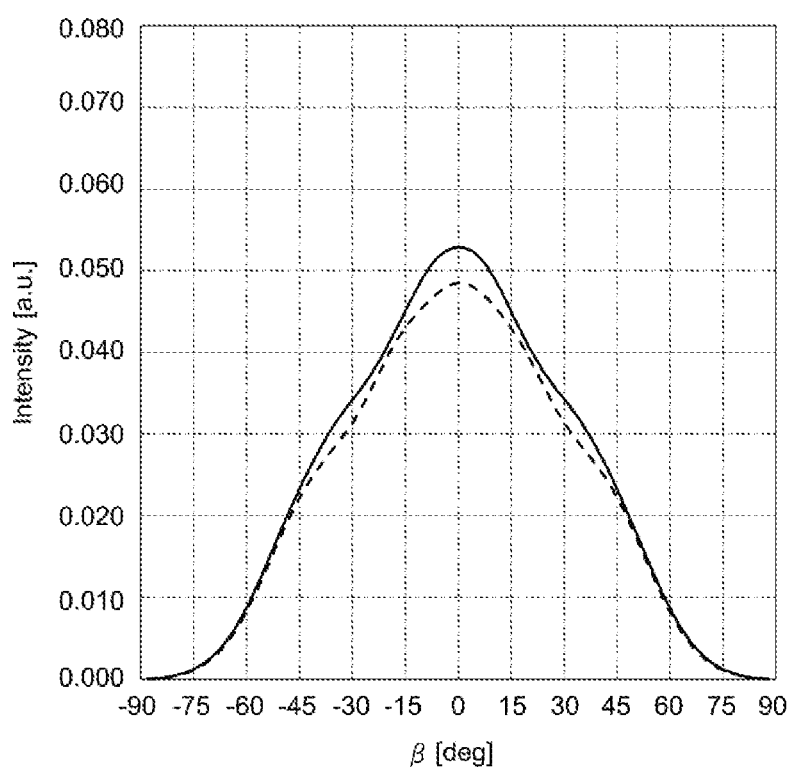
FIG. 19 shows two distribution curves of luminous intensity of a light emitting element, with one curve being obtained when a heat treatment is applied to a fine structure, and the other curve being obtained when no heat treatment is applied.

FIG. 19 illustrates two curves of luminous intensity of the light emitting element that has a moth eye structure thereon. FIG. 19 shows that the luminous intensity curve changes with the shape of the moth eye structure (shape). In this drawing, the solid line indicates the luminous intensity when the moth eye structure has a perfect circular shape in the trigonal array, which is obtained when the heat treatment is applied. The broken line indicates the luminous intensity when the moth eye structure has an oval shape in the trigonal array, which is obtained when no heat treatment is applied. It is confirmed from FIG. 19 that the light intensity at an angle $\beta=0$ and in the vicinity thereof is increased by shaping the moth eye structure from the ellipse to the perfect circle in the heat treatment. The solid line curve draws a line above the broken line curve in FIG. 19. The angle $\beta$ is a light emitting angle from the light emitting element.

In this embodiment, the arrangement of the dots in the resist pattern can be altered by altering the turning angle $\delta$ of the interference pattern from the first exposure to the second exposure in the interference exposure step. In addition, the shape of the resist pattern can be altered by altering the heating conditions of the heat treatment. Thus, it is possible to manufacture a moth eye structure that has a desired arrangement and a desired dot intensity in the X-Y plane.

Second Embodiment

A second embodiment of the present invention will be described below with reference to FIGS. 20, 21A, and 21B.

The second embodiment is similar to the first embodiment except the turn-around mirrors 7a and 7b of the first embodiment being replaced with turn-around mirrors 17a and 17b, respectively in the second embodiment.

The turn-around mirrors 17a and 17b in the second embodiment are angle-adjustable mirrors whereas the turn-around mirrors 7a and 7b in the first embodiment are stationary mirrors. In the following description, the same reference numerals and symbols are used to designate the same components in the first and second embodiments.

Figure 20:
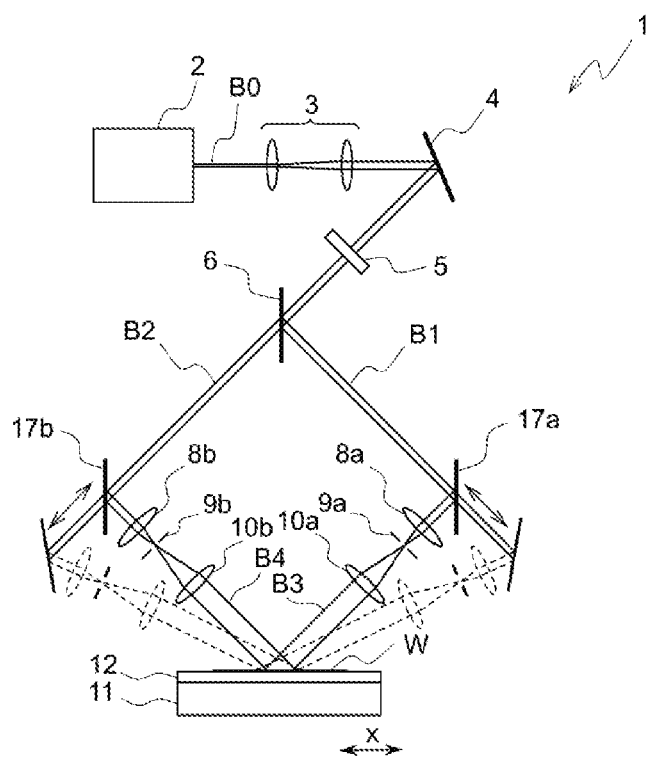
FIG. 20 illustrates a schematic configuration of an exposure device to a second embodiment of the present invention.

FIG. 20 shows a schematic configuration of the exposure device 1 of the second embodiment.

Each of the angle-adjustable mirrors 17a and 17b of the exposure device 1 is configured to be able to change the angle of the light incident plane. By changing the angle of the light incident plane of each of the mirrors 17a and 17b, the interference angle 2θ is changed to a desired angle. As the interference angle 2θ changes, the line pitch in the interference pattern (stripe pattern) formed on the substrate changes.

Figure 21A:
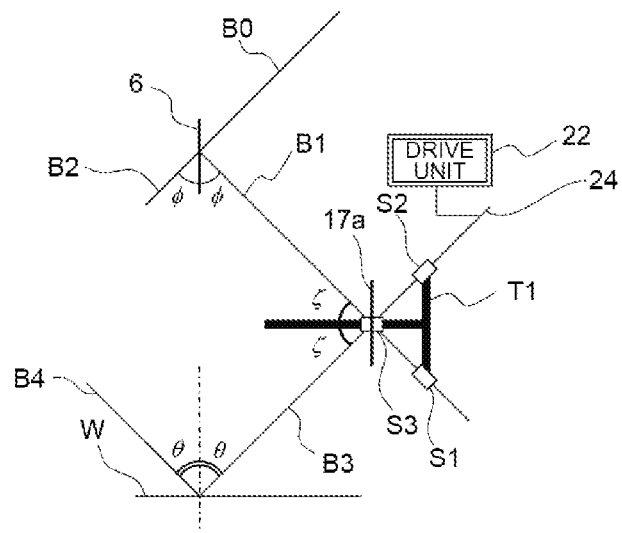
FIG. 21A shows a mechanism of an angle-adjustable mirror.
Figure 21B:
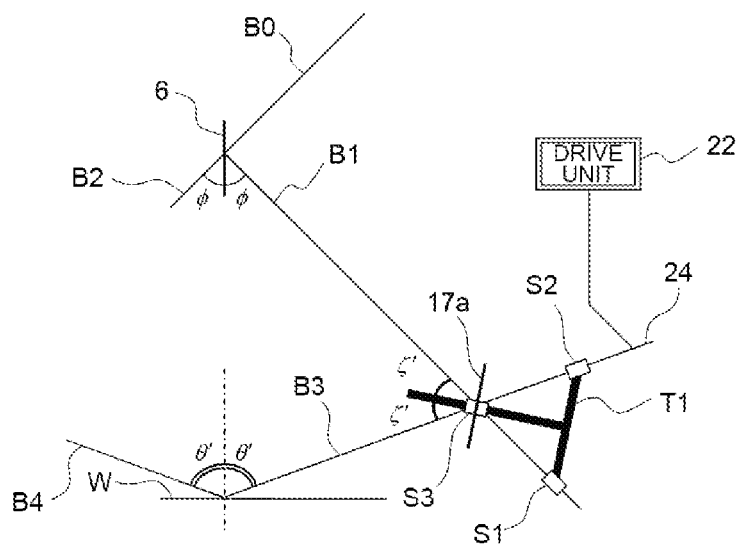
FIG. 21B shows the angle-adjustable mirror that is moved and turned by its mechanism.

FIGS. 21A and 21B illustrate the mirror 17a and a mechanism for changing the angle of the mirror 17a. The mirror 17b is equipped with the same mechanism as the mirror 17a. The mirror 17a has the same configuration as the mirror 17b.

The mirror 17a is a component for adjusting (changing) the interference angle θ to a desired angle θ'. The mirror 17a moves along a straight line defined by the beam B1, which is one of the two branch beams prepared at the beam splitter 6. The mirror 17a can also change its angle (inclination) about an axis that extends through its center in a direction perpendicular to the drawing sheet of FIG. 21A. The beam B1 is reflected by the mirror 17a and becomes the reflection beam B3 (i.e., mirror-reflected beam). The reflection beam B3 is directed to a predetermined location on the work W. The mirror-reflected beam B4 from the mirror 17b (not shown in FIG. 21A) combines (interferes) with the mirror-reflected beam B3 on the work W to create the interference fringes (interference beam). The normal line from the mirror 17a equally divides the angle between the branch beam B1 and the mirror-reflected beam B3 in FIG. 21A.

A method of adjusting the interference angle θ of the beam B3 while maintaining the positional relation between the normal line from the mirror 17a and the reflecting plane of the mirror 17a, for example, includes preparing a T-shaped frame T1, as shown in FIGS. 21A and 21B, and preparing a mechanism that uses (actuates) the T-shaped frame T1. The frame T1 has three sliders S1, S2 and S3. The slider S1 moves along the straight line defined by the branch beam B1 (diagonally downward to the right in FIG. 21A), and the slider S2 moves along the straight line defined by the mirror-reflected beam B3 (diagonally upward to the right in FIG. 21A). The slider S3 moves along the frame T1 (to the left horizontally in FIG. 21A). The mirror 17a is mounted on the slider S3. The slider S1 and S2 are secured to the frame T1.

The location of the rotation axis of the mirror 17a is the intersecting point of the branch beam B1 and the reflection beam B3. When the interference angle θ of the beam B3 is changed to an angle θ', the normal line from the mirror 17a turns in a desired direction, with the normal line from the mirror 17a keeping equally dividing the angle between the branch beam B1 and the reflection beam B3, as shown in FIG. 21B.

The interference angle θ decided by the mirror 17a is changed to the angle θ' by a drive unit (actuator) 22. The mirror 17b has the same drive unit as the mirror 17a. One of the drive units 22 is illustrated in FIGS. 21A and 21B. The drive unit 22 applies a force onto a member 24 that extends from the frame T1 along the straight line defined by the reflection beam B3 when the drive unit 22 changes the interference angle θ of the beam B3. It should be noted that the drive unit 22 may directly apply a force onto the frame T1 to change the interference angle θ of the beam B3. The direction of the beam B4 is changed in the same manner by the mirror 17b that is moved by the associated drive unit (not shown).

As described above, the exposure device 1 of this embodiment includes the angle adjustable mirrors 17a and 17b to change the reflecting directions of the beams B1 and B2 (FIG. 20), which are the two branch beams prepared at the beam branching element 6, and direct the reflection beams B3 and B4 toward the substrate or work W such that the two reflection beams B3 and B4 cross each other at a desired angle 2θ' on the work W. Thus, it is possible to arbitrarily alter the pitch of the stripe pattern (interference pattern) to be formed on the work W. In other words, it is possible to change the pitch of the resist pattern (dot density in the resist pattern) which is obtained upon applying the exposure process a plurality of times.

Modifications

Figure 22:
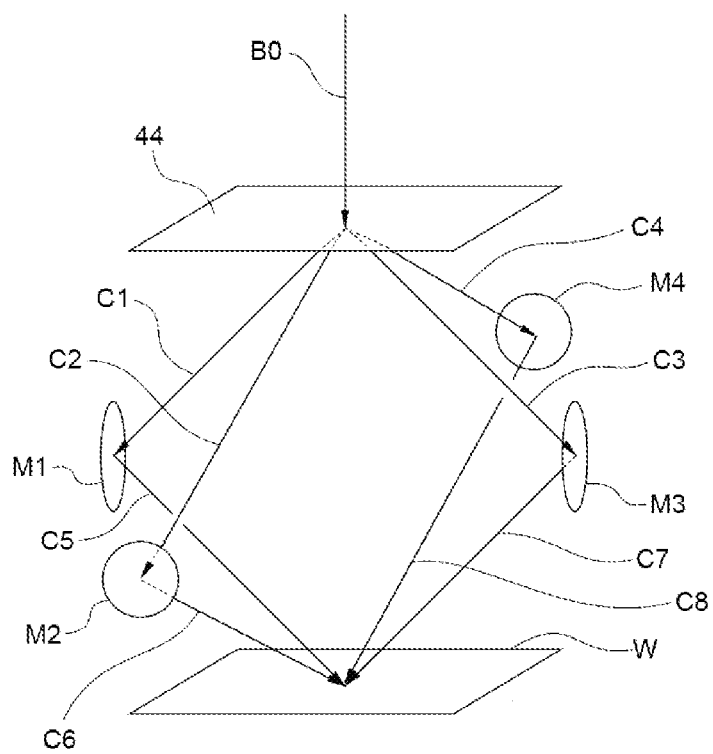
FIG. 22 is a schematic view useful to describe a multi-beam interference exposure method.

Although the above-described embodiments deal with the two-beam interference exposure, the present invention is not limited in this regard. For example, the beam from the light source may be divided into three or more beams, and these beams may simultaneously be directed to the substrate. In other words, so-called multi-beam interference exposure may be used in the present invention. An optical element for dividing the beam may include a diffracting element that divides, for example, a laser beam into a plurality of beams. For example, if the multi-beam interference exposure should provide the same result as the two-beam interference exposure of the first embodiment, with the angle difference δ between the first interference beam and the second interference beam being 90 degrees, then four beams may be used as shown in FIG. 22. Specifically, a single beam (laser beam) B0 from the light source is divided into four beams C1, C2, C3 and C4 by a beam splitting element 44 in FIG. 22. The beam splitting element 44 may be a diffraction element. The four branch beams C1-C4 are reflected by the associated four mirrors M1, M2, M3 and M4, and become four reflection beams C5, C6, C7 and C8, respectively. The four reflection beams C5-C8 are directed to the work W. The triangle defined by the beam C1, its reflection beam C5 and the normal line from the work W is 90-degree spaced from the triangle defined by the beam C2, its reflection beam C6 and the normal line from the work W when viewed from the top. The triangle defined by the beam C2, its reflection beam C6 and the normal line from the work W is 90-degree spaced from the triangle defined by the beam C3, its reflection beam C7 and the normal line from the work W when viewed from the top. The triangle defined by the beam C3, its reflection beam C7 and the normal line from the work W is 90-degree spaced from the triangle defined by the beam C4, its reflection beam C8 and the normal line from the work W when viewed from the top. The angle defined by the two opposite reflection beams C5 and C7 is 2θ, and the angle defined by the two opposite branch beams C6 and C8 is 2θ. The arrangement of the optical components is decided to satisfy the above-mentioned numerical values.

The photonic structure is formed in the fluorescent substrate or the functional material layer disposed on the fluorescent substrate by the interference exposure process, the developing process and the etching process in the above-described embodiments. The present invention is not limited in this regard. For example, a laser ablation with high-output pulse laser may be used. The fluorescent substrate or the functional material layer disposed on the fluorescent substrate may directly be processed by the pattern(s) of the interference beam(s).

The above-described embodiments deal with a method of manufacturing a light emitting element of a fluorescent light source device by a surface fine processing method with the two-beam interference exposure. It should be noted that if the functional material layer is provided on the fluorescent substrate, the exposure method is not limited to the two-beam interference exposure. For example, if a zirconia ($ZrO_2$) layer or the like is the functional material layer that is provided on the fluorescent substrate, an exposure method other than the two-beam interference exposure may be employed. This is because the zirconia layer is easy to process. Then, it is possible to provide a photonic structure in a desired manner.

In the first and second embodiments, the resist pattern that is obtained by the two-beam interference exposure is shaped to a desired pattern by the heat treatment. The present invention is not limited in this regard. For example, the fine pattern which is obtained by a nanoimprint method, a stepper or the like may be shaped to a desired pattern by the heat treatment. For example, the nanoimprint method may be used to obtain the fine pattern having a plurality of convex portions, and the heat treatment is applied to the fine pattern such that the spacing between the adjacent convex portions is reduced to increase the resolution (density). The heat treatment shapes the fine pattern such that the resolution of the fine pattern after the heat treatment becomes greater than the resolution of the fine pattern before the heat treatment.

It is known that a film may be deposited on a surface of a resist pattern by plasma in order to enlarge the width of each convex portion in the resist pattern. This conventional technique may be used to reduce the spacing between the adjacent convex portions in the fine pattern. However, the film deposition over the convex portions may not be carried out precisely because of the distribution of the plasma. On the contrary, the embodiments of the present invention employ the heat treatment. The heat treatment can precisely shape the resist pattern. Therefore, it is possible to appropriately improve the resolution (dot density) of the resist pattern.

While certain embodiments have been described, these embodiments have been presented by way of example only, and are not intended to limit the scope of the present invention. The novel apparatuses (devices) and methods thereof described herein may be embodied in a variety of other forms; furthermore, various omissions, substitutions and changes in the form of the apparatuses (devices) and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2014-244340, filed on Dec. 2, 2014, and the entire contents of which are incorporated herein by reference.

What is claimed is:

1. A method of manufacturing a light emitting element of a fluorescent light source, the light emitting element having a fluorescent substrate and a photonic structure on a surface of the fluorescent substrate or a surface of a functional material layer, the functional material layer being formed on the fluorescent substrate, the fluorescent substrate containing a fluorescent material that is excited by an excitation beam, the method comprising:

forming a photosensitive material layer on the surface of the fluorescent substrate or the surface of the functional material layer;

dividing a single beam emitted from a coherent light source into at least two branch beams;

causing the at least two branch beams to cross each other at a predetermined interference angle thereby generating a first interference beam that has a first longitudinal direction;

applying an exposure process to the photosensitive material layer with the first interference beam;

producing a second interference beam from the at least two branch beams such that the second interference beam has a second longitudinal direction, which crosses the first longitudinal direction of the first interference beam at a first predetermined angle, the second interference beam having the predetermined interference angle;

applying the exposure process to the photosensitive material layer with the second interference beam after said applying an exposure process to the photosensitive material layer with the first interference beam;

removing those areas of the photosensitive material layer which are irradiated with the first and second interference beams or removing those areas of the photosensitive material layer which are not irradiated with the first and second interference beams, after the exposure process with the first and second interference beams, thereby forming a first fine pattern in the photosensitive material layer; and applying an etching process to the fluorescent substrate or the functional material layer with the first fine pattern of the photosensitive material layer, thereby creating the photonic structure on the surface of the fluorescent substrate or the surface of the functional material layer.

2. The method according to claim 1, wherein said producing the second interference beam and said applying the exposure process to the photosensitive material layer with the second interference beam are carried out such that said removing those areas of the photosensitive material layer can form the first fine pattern that has a plurality of convex portions in a square array.

3. The method according to claim 1, wherein said producing the second interference beam and said applying the exposure process to the photosensitive material layer with the second interference beam are carried out such that said removing those areas of the photosensitive material layer can form the first fine pattern that has a plurality of convex portions in a trigonal array.

4. The method according to claim 1 further comprising;
producing another interference beam from the at least two branch beams such that said another interference beam has another longitudinal direction, which crosses the first longitudinal direction of the first interference beam at a second predetermined angle, said another interference beam having the predetermined interference angle; and applying the exposure process to the photosensitive material layer with said another interference beam after said applying the exposure process to the photosensitive material layer with the second interference beam.

5. The method according to claim 1 further comprising turning the fluorescent substrate by the first predetermined angle after said applying an exposure process to the photosensitive material layer with the first interference beam and before applying the exposure process to the photosensitive material layer with the second interference beam.

6. The method according to claim 1 further comprising, prior to said applying an etching process, applying a heat treatment to the first fine pattern formed in the photosensitive material layer, thereby shaping the first fine pattern to a second fine pattern.

7. The method according to claim 6, wherein the photosensitive material layer is made from a material having a glass-transition temperature, and said applying a heat treatment includes heating the first fine pattern at a temperature higher than the glass-transition temperature.

8. The method according to claim 1, wherein the second longitudinal direction of the second interference beam crosses the first longitudinal direction of the first interference beam at 90 degrees.

9. The method according to claim 1, wherein the second longitudinal direction of the second interference beam crosses the first longitudinal direction of the first interference beam at 60 degrees.

10. The method according to claim 1, wherein the photonic structure includes a moth eye structure.

11. A method of manufacturing a light emitting element of a fluorescent light source, the light emitting element having a fluorescent substrate and a photonic structure on a surface of the fluorescent substrate or a surface of a functional material layer, the functional material layer being formed on the fluorescent substrate, the fluorescent substrate containing a fluorescent material that is excited by an excitation beam, the method comprising:

forming a photosensitive material layer on the surface of the fluorescent substrate or the surface of the functional material layer;

applying an exposure process to the photosensitive material layer with a first exposure beam;

applying the exposure process to the photosensitive material layer with a second exposure beam after said applying an exposure process to the photosensitive material layer with the first exposure beam;

removing those areas of the photosensitive material layer which are irradiated with the first and second exposure beams or removing those areas of the photosensitive material layer which are not irradiated with the first and second exposure beams, after the exposure process with the first and second exposure beams, thereby forming a first fine pattern in the photosensitive material layer; and applying an etching process to the fluorescent substrate or the functional material layer with the first fine pattern of the photosensitive material layer, thereby creating the photonic structure on the surface of the fluorescent substrate or the surface of the functional material layer.

12. The method according to claim 11 further comprising, prior to said applying an etching process, applying a heat treatment to the first fine pattern formed in the photosensitive material layer, thereby shaping the first fine pattern to a second fine pattern.

13. The method according to claim 12, wherein the photosensitive material layer is made from a material having a glass-transition temperature, and said applying a heat treatment includes heating the first fine pattern at a temperature higher than the glass-transition temperature.

14. The method according to claim 11, wherein said photonic structure includes a moth eye structure.

15. A method of manufacturing a light emitting element of a fluorescent light source, the light emitting element having a fluorescent substrate and a photonic structure on a surface of the fluorescent substrate or a surface of a functional material layer, the functional material layer being formed on the fluorescent substrate, the fluorescent substrate containing a fluorescent material that is excited by an excitation beam, the method comprising:
  dividing a single beam emitted from a coherent light source into at least two branch beams;
  causing the at least two branch beams to cross each other at a predetermined interference angle thereby generating a first interference beam that has a first longitudinal direction;
  applying an exposure process to the fluorescent substrate or the functional material layer with the first interference beam;
  producing a second interference beam from the at least two branch beams such that the second interference beam has a second longitudinal direction, which crosses the first longitudinal direction of the first interference beam at a first predetermined angle, the second interference beam having the predetermined interference angle;
  applying the exposure process to the fluorescent substrate or the functional material layer with the second interference beam after said applying an exposure process to the fluorescent substrate or the functional material layer with the first interference beam; and
  removing part of the fluorescent substrate or the functional material layer, thereby forming the photonic structure.

16. The method according to claim 15, wherein said photonic structure includes a moth eye structure.

17. A method of manufacturing a light emitting element of a fluorescent light source, the light emitting element including a fluorescent substrate and a photonic structure on a surface of the fluorescent substrate, the fluorescent substrate containing a fluorescent material which is excited by an excitation beam, the method comprising:
  forming a first layer on the surface of the fluorescent substrate;
  forming a first fine pattern in the first layer;
  applying a heat treatment to the first fine pattern to shape the first fine pattern to a second fine pattern; and
  applying an etching process to the fluorescent substrate with the second fine pattern, thereby creating the photonic structure on the surface of the fluorescent substrate.

18. The method according to claim 17, wherein said photonic structure includes a moth eye structure.

19. A method of manufacturing a light emitting element of a fluorescent light source, the light emitting element having a fluorescent substrate and a photonic structure on a surface of the fluorescent substrate or a surface of a functional material layer, the functional material layer being formed on the fluorescent substrate, the fluorescent substrate containing a fluorescent material that is excited by an excitation beam, the method comprising:
  forming a photosensitive material layer on the surface of the fluorescent substrate or the surface of the functional material layer;
  dividing a single beam emitted from a coherent light source into at least two branch beams;
  causing the at least two branch beams to cross each other at a predetermined interference angle thereby generating an interference beam;
  applying an exposure process to the photosensitive material layer with the interference beam;
  removing those areas of the photosensitive material layer which are irradiated with the interference beam or removing those areas of the photosensitive material layer which are not irradiated with the interference beam, after the exposure process with the interference beam, thereby forming a fine pattern in the photosensitive material layer; and
  applying an etching process to the fluorescent substrate or the functional material layer with the fine pattern of the photosensitive material layer, thereby creating the photonic structure on the surface of the fluorescent substrate or the surface of the functional material layer.

20. A method of manufacturing a light emitting element of a fluorescent light source, the light emitting element having a fluorescent substrate and a photonic structure on a surface of the fluorescent substrate or a surface of a functional material layer, the functional material layer being formed on the fluorescent substrate, the fluorescent substrate containing a fluorescent material that is excited by an excitation beam, the method comprising:
  forming a photosensitive material layer on the surface of the fluorescent substrate or the surface of the functional material layer;
  applying an exposure process to the photosensitive material layer with a exposure beam;
  removing those areas of the photosensitive material layer which are irradiated with the exposure beams or removing those areas of the photosensitive material layer which are not irradiated with the exposure beams, after the exposure process with the exposure beams, thereby forming a fine pattern in the photosensitive material layer; and
  applying an etching process to the fluorescent substrate or the functional material layer with the fine pattern of the photosensitive material layer, thereby creating the photonic structure on the surface of the fluorescent substrate or the surface of the functional material layer.

* * * * *